(12) United States Patent
Marietta

(10) Patent No.: US 11,467,902 B2
(45) Date of Patent: Oct. 11, 2022

(54) APPARATUS TO INSERT ERROR-CORRECTING CODING (ECC) INFORMATION AS DATA WITHIN DYNAMIC RANDOM ACCESS MEMORY (DRAM)

(71) Applicant: Samsung Electronics Co., Ltd., Suwon-si (KR)

(72) Inventor: Bryan D. Marietta, Cedar Park, TX (US)

(73) Assignee: SAMSUNG ELECTRONICS CO., LTD.

( * ) Notice: Subject to any disclaimer, the term of this patent is extended or adjusted under 35 U.S.C. 154(b) by 19 days.

(21) Appl. No.: 17/100,805

(22) Filed: Nov. 20, 2020

(65) Prior Publication Data

US 2021/0073073 A1   Mar. 11, 2021

Related U.S. Application Data

(62) Division of application No. 16/026,008, filed on Jul. 2, 2018, now Pat. No. 10,853,168.

(Continued)

(51) Int. Cl.
  *G11C 29/00* (2006.01)
  *G06F 11/10* (2006.01)
  (Continued)

(52) U.S. Cl.
  CPC ...... *G06F 11/1068* (2013.01); *G06F 12/0607* (2013.01); *G06F 12/0895* (2013.01);
  (Continued)

(58) Field of Classification Search
  CPC ............. G06F 11/1068; G06F 12/0607; G06F 12/0895; G06F 2212/608
  See application file for complete search history.

(56) References Cited

U.S. PATENT DOCUMENTS 8,347,171 B2   1/2013  Seo
8,924,832 B1  12/2014  Lam
(Continued)

FOREIGN PATENT DOCUMENTS

| CN | 101923896 A | 12/2010 |
| TW | 201339836 A | 10/2013 |
| WO | 2016030974 A1 | 3/2016 |

OTHER PUBLICATIONS

Notice of Allowance for U.S. Appl. No. 16/026,008, dated Jul. 24, 2020.
(Continued)

*Primary Examiner* — Esaw T Abraham
(74) *Attorney, Agent, or Firm* — Renaissance IP Law Group LLP

(57) ABSTRACT

According to one general aspect, an apparatus may include a memory configured to store both data and metadata, such that for portions of data associated with the metadata, the data and metadata are interleaved such that a unit of metadata succeeds each power of two contiguous units of data. The apparatus may also include a memory manager circuit. The memory management circuit may be configured to receive a data access to the memory, wherein the data access includes a public memory address. The memory management circuit may be configured to determine if the public memory address is associated with metadata. The memory management circuit may be configured to, if so, convert the public memory address to a private memory address. The memory management circuit may be configured to complete the data access at the private memory address.

20 Claims, 7 Drawing Sheets

Related U.S. Application Data

(60) Provisional application No. 62/649,524, filed on Mar. 28, 2018.

(51) Int. Cl.
*G11C 29/52* (2006.01)
*G06F 12/0895* (2016.01)
*G06F 12/06* (2006.01)

(52) U.S. Cl.
CPC ...... *G11C 29/52* (2013.01); *G06F 2212/1032* (2013.01); *G06F 2212/608* (2013.01)

(56) References Cited

U.S. PATENT DOCUMENTS

| | | | |
|---|---|---|---|
| 8,996,951 B2 * | 3/2015 | Hyde | G06F 11/0703 714/763 |
| 9,003,082 B2 | 4/2015 | Okada et al. | |
| 9,043,663 B2 | 5/2015 | Minotani et al. | |
| 9,116,823 B2 | 8/2015 | Fillingim et al. | |
| 9,213,594 B2 | 12/2015 | Strasser et al. | |
| 9,495,241 B2 | 11/2016 | Flynn et al. | |
| 9,594,627 B2 | 3/2017 | Kanno et al. | |
| 9,720,627 B2 | 8/2017 | Chen et al. | |
| 9,766,974 B2 | 9/2017 | Hsiao et al. | |
| 9,792,067 B2 | 10/2017 | Tomlin | |
| 9,817,714 B2 | 11/2017 | Halbert et al. | |
| 9,875,180 B2 * | 1/2018 | Talagala | G06F 3/0608 |
| 10,031,802 B2 * | 7/2018 | Vogt | G06F 11/1052 |
| 10,055,164 B2 * | 8/2018 | Benisty | G06F 11/1048 |
| 10,055,294 B2 * | 8/2018 | Hyun | G06F 11/108 |
| 10,061,710 B2 | 8/2018 | Kawamura et al. | |
| 10,069,597 B2 | 9/2018 | Benisty et al. | |
| 10,114,549 B2 | 10/2018 | Alrod et al. | |
| 10,248,328 B2 * | 4/2019 | Lee | G06F 3/0646 |
| 10,445,229 B1 * | 10/2019 | Kuzmin | G06F 8/654 |
| 10,540,297 B2 | 1/2020 | Saileshwar et al. | |
| 2004/0199853 A1 | 10/2004 | Hwang et al. | |
| 2005/0028067 A1 | 2/2005 | Weirauch | |
| 2010/0318874 A1 | 12/2010 | Hung et al. | |
| 2013/0332665 A1 | 12/2013 | Sikdar et al. | |
| 2015/0033096 A1 | 1/2015 | Radke et al. | |

OTHER PUBLICATIONS

Office Action for U.S. Appl. No. 16/026,008, dated Mar. 10, 2020.

* cited by examiner

| Public Addr 302 | Contents 304 | Cacheline number 306 | Chunk 308 | Chunk byte addr 310 | Meta offset 312 | Private |
|---|---|---|---|---|---|---|
| 0x2400000 | Data | 0 | 0 | 0 | 0 | 0x24 |
| 0x2400040 | Data | 1 | 0 | 0 | 0 | 0x24 |
| 0x2400080 | Data | 2 | 0 | 0 | 0 | 0x24 |
| 0x24000C0 | Data | 3 | 0 | 0 | 0 | 0x24 |
| 0x2400100 | Data | 4 | 0 | 0 | 0 | 0x24 |
| 0x2400140 | Data | 5 | 0 | 0 | 0 | 0x24 |
| 0x2400180 | Data | 6 | 0 | 0 | 0 | 0x24 |
| 0x24001C0 | Meta | 7 | 0 | 0 | 0 | 0x24 |
| 0x2400200 | Data | 8 | 1 | 200 | 40 | 0x2400240 |
| 0x2400240 | Data | 9 | 1 | 200 | 40 | 0x2400280 |
| 0x2400280 | Data | A | 1 | 200 | 40 | 0x24002C0 |
| 0x24002C0 | Data | B | 1 | 200 | 40 | 0x2400300 |
| 0x2400300 | Data | C | 1 | 200 | 40 | 0x2400340 |
| 0x2400340 | Data | D | 1 | 200 | 40 | 0x2400380 |
| 0x2400380 | Data | E | 1 | 200 | 40 | 0x24003C0 |
| 0x24003C0 | Meta | F | 1 | 200 | 40 | 0x2400400 |
| 0x2400400 | Keep Out | | | | | NA |
| 0x2400440 | Keep Out | | | | | NA |

350

320

318

322

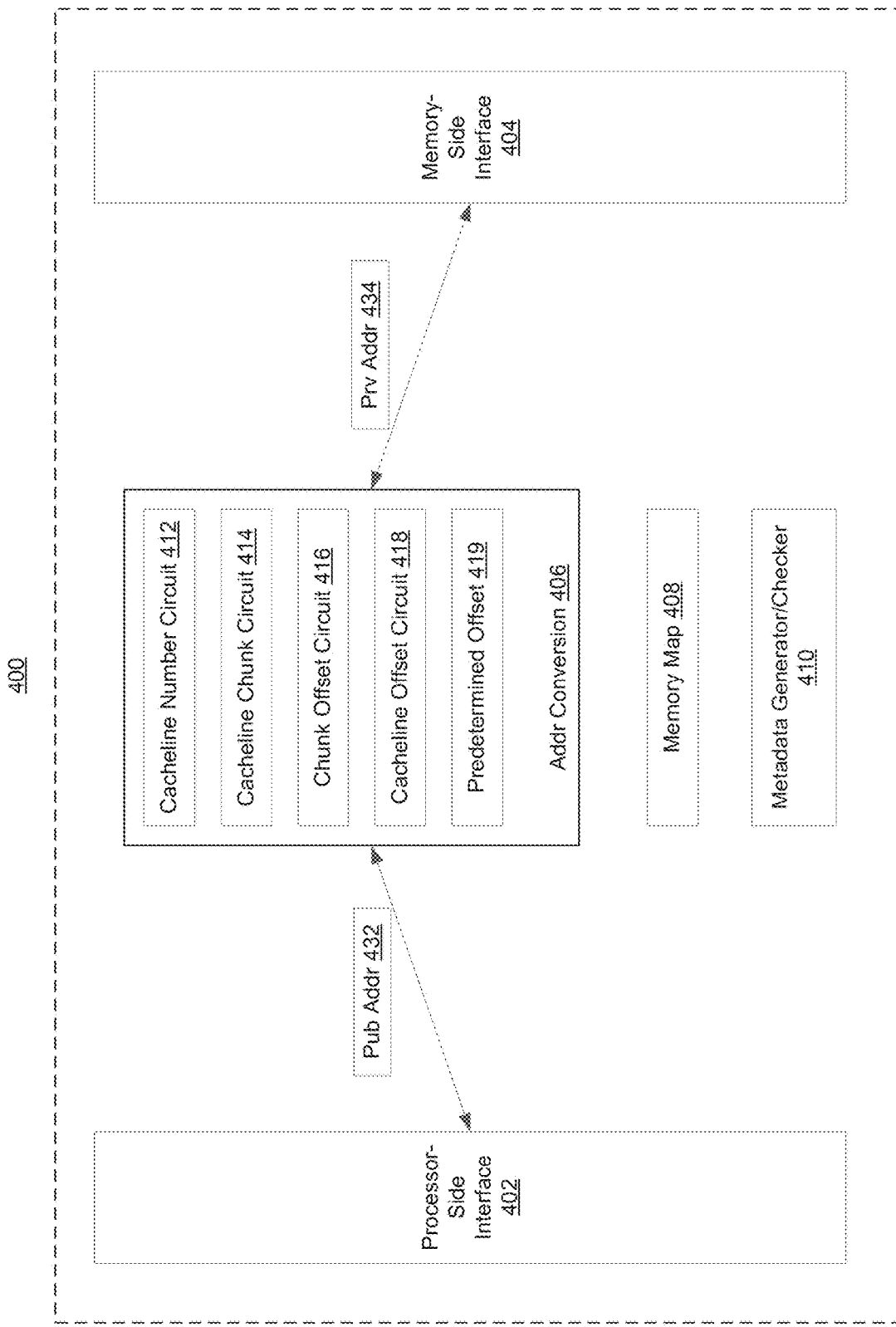

500

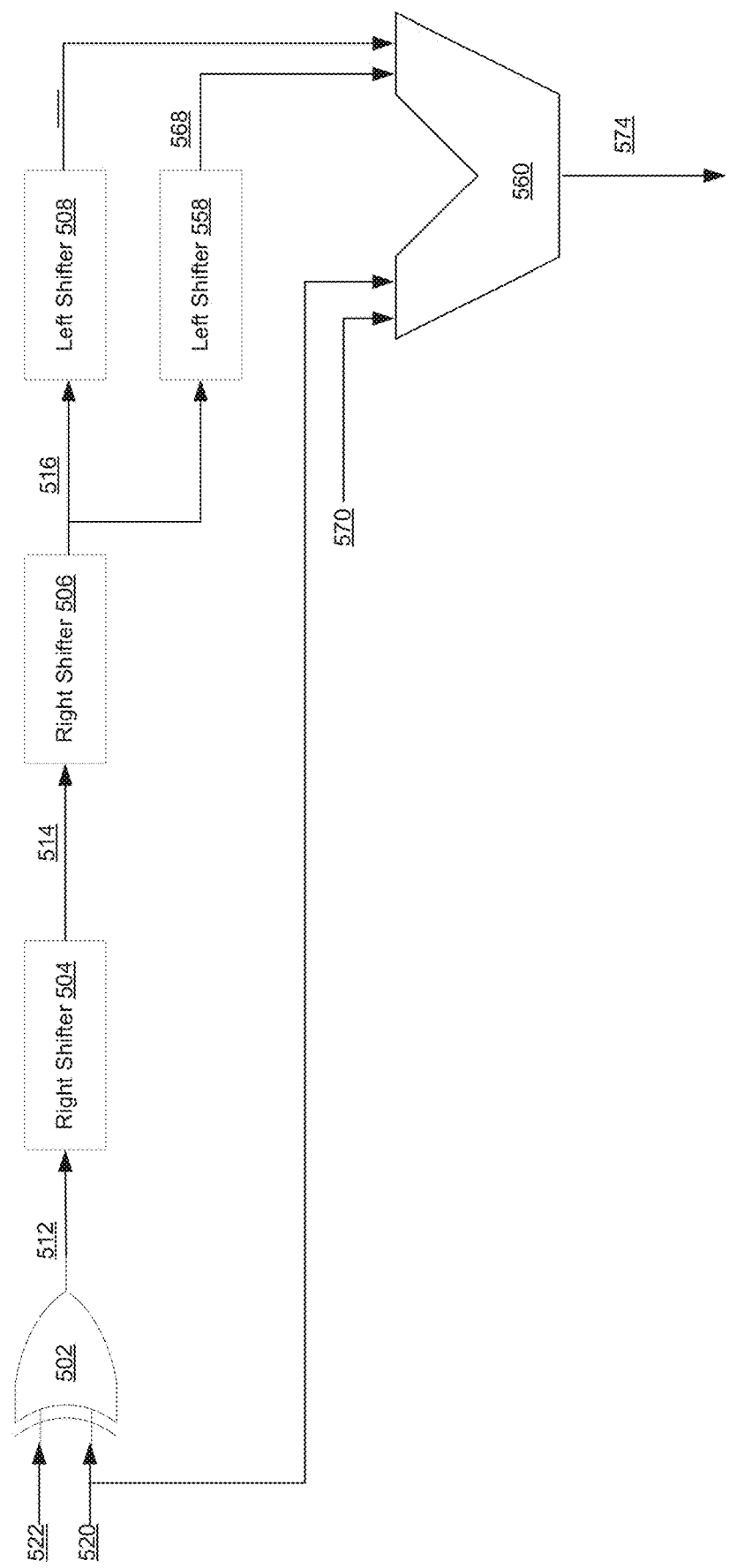

APPARATUS TO INSERT ERROR-CORRECTING CODING (ECC) INFORMATION AS DATA WITHIN DYNAMIC RANDOM ACCESS MEMORY (DRAM)

CROSS-REFERENCE TO RELATED APPLICATIONS

This application is a divisional of, and claims priority under 35 U.S.C. § 120 to, application Ser. No. 16/026,008, filed on Jul. 2, 2018, (now U.S. Pat. No. 10,853,168, issued Dec. 1, 2020), which in turn claims priority under 35 U.S.C. § 119 to Provisional Patent Application Serial No. 62/649,524, entitled "IN-BAND DRAM ECC" filed on Mar. 28, 2018. The subject matter of the earlier filed applications are hereby incorporated by reference.

TECHNICAL FIELD

This description relates to computer memory management, and more specifically to in-band dynamic random access memory (DRAM) error-correcting coding (ECC).

BACKGROUND

Modern semiconductor memory devices often use error checking and error correction bits to provide a reliable storage means for processors or other components. Generally, error-correcting code memory (ECC memory) is a type of computer data storage that may detect and/or correct the most common kinds of internal data corruption. ECC memory is used in most computers where data corruption cannot be tolerated under any circumstances, such as for scientific or financial computing.

Ideally, ECC memory creates a memory system in which the data that is read from each word or memory location is always the same as the data that had been written to it, even if a single bit (or more in some cases) that was actually stored has been flipped or changed to the wrong state (e.g., a "1" to a "0", etc.). Traditionally a method of providing that memory protection is to use a Hamming code that is calculated based on the data portion of each memory word, typically 32 or 64 bits wide. Often, the Hamming code is chosen such that it can correct single bit errors in the memory word, and detect up to two total memory bits in error.

Some non-ECC memory with parity support allows errors to be detected, but not corrected; otherwise errors are not detected. In such a system, one or more extra bits of data are added to a memory. These extra bits indicate whether or not the actual or subject data includes an even or odd number of "1"s. Generally, with such a system the flipping of a single-bit within the actual data may be detected but not corrected.

Often the ECC code word or parity bit(s) are stored and fetched in parallel with the data word and the check is generated (for writes) and/or verified (for reads) as the memory access takes place. Generally, an immediate or substantially immediate correction or detection of errors is possible.

SUMMARY

According to one general aspect, an apparatus may include a memory configured to store both data and metadata, such that for portions of data associated with the metadata, the data and metadata are interleaved such that a unit of metadata succeeds each power of two contiguous units of data. The apparatus may also include a memory manager circuit. The memory management circuit may be configured to receive a data access to the memory, wherein the data access includes a public memory address. The memory management circuit may be configured to determine if the public memory address is associated with metadata. The memory management circuit may be configured to, if so, convert the public memory address to a private memory address. The memory management circuit may be configured to complete the data access at the private memory address.

According to another general aspect, an apparatus may include a first interface for receiving a data access based upon a public memory address. The apparatus may include a second interface for communicating with a memory to fulfill the data access, wherein the apparatus is configured to cause the memory to store data and metadata together in an interleaved pattern in which a unit of metadata succeeds each power of two contiguous units of data. The apparatus may include an address conversion circuit configured to convert the public memory address to a private memory address in a way that takes into account the interleaving of the data and metadata.

According to another general aspect, a system may include a memory configured to store both data and metadata, such that for portions of data associated with the metadata, wherein the data and metadata are interleaved such that a unit of metadata succeeds each power of two contiguous units of data. The system may include a system-on-a-chip (SoC). The SoC may include a processor request data accesses, and a memory manager circuit. The memory manager circuit may be configured to: receive a data access to the memory, wherein the data access includes a public memory address, determine if the public memory address is associated with metadata, if so, convert the public memory address to a private memory address, and complete the data access at the private memory address.

The details of one or more implementations are set forth in the accompanying drawings and the description below. Other features will be apparent from the description and drawings, and from the claims.

A system and/or method for computer memory management, and more specifically to in-band dynamic random access memory (DRAM) error-correcting coding (ECC), substantially as shown in and/or described in connection with at least one of the figures, as set forth more completely in the claims.

BRIEF DESCRIPTION OF THE DRAWINGS

FIG. 3 is a diagram of an example embodiment of a technique in accordance with the disclosed subject matter.

FIG. 4 is a block diagram of an example embodiment of a system in accordance with the disclosed subject matter.

FIG. 5B is a block diagram of an example embodiment of a system in accordance with the disclosed subject matter.

DETAILED DESCRIPTION

Figure 1:
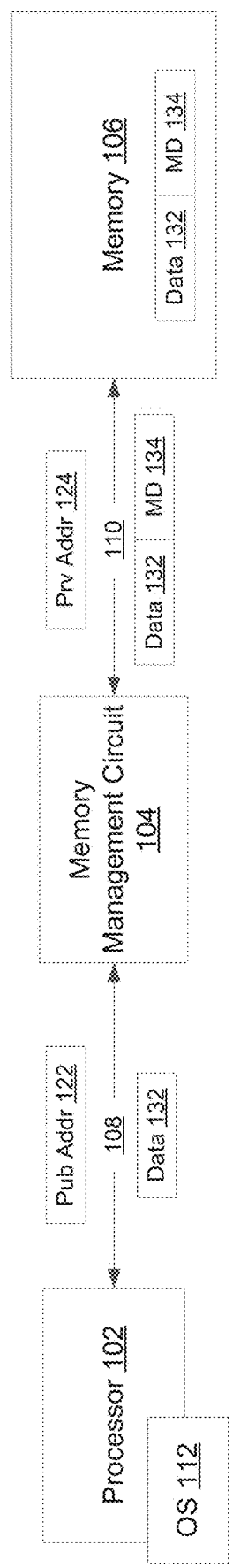
FIG. 1 is a block diagram of an example embodiment of a system in accordance with the disclosed subject matter.

Various example embodiments will be described more fully hereinafter with reference to the accompanying drawings, in which some example embodiments are shown. The present disclosed subject matter may, however, be embodied in many different forms and should not be construed as limited to the example embodiments set forth herein. Rather, these example embodiments are provided so that this disclosure will be thorough and complete, and will fully convey the scope of the present disclosed subject matter to those skilled in the art. In the drawings, the sizes and relative sizes of layers and regions may be exaggerated for clarity.

It will be understood that when an element or layer is referred to as being "on," "connected to" or "coupled to" another element or layer, it may be directly on, connected or coupled to the other element or layer or intervening elements or layers may be present. In contrast, when an element is referred to as being "directly on", "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, and so on may be used herein to describe various elements, components, regions, layers and/or sections, these elements, components, regions, layers and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of the present disclosed subject matter.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations), and the spatially relative descriptors used herein should be interpreted accordingly.

Likewise, electrical terms, such as "high" "low", "pull up", "pull down", "1", "0" and the like, may be used herein for ease of description to describe a voltage level or current relative to other voltage levels or to another element(s) or feature(s) as illustrated in the figures. It will be understood that the electrical relative terms are intended to encompass different reference voltages of the device in use or operation in addition to the voltages or currents depicted in the figures. For example, if the device or signals in the figures are inverted or use other reference voltages, currents, or charges, elements described as "high" or "pulled up" would then be "low" or "pulled down" compared to the new reference voltage or current. Thus, the exemplary term "high" may encompass both a relatively low or high voltage or current. The device may be otherwise based upon different electrical frames of reference and the electrical relative descriptors used herein interpreted accordingly.

The terminology used herein is for the purpose of describing particular example embodiments only and is not intended to be limiting of the present disclosed subject matter. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present disclosed subject matter.

Unless otherwise defined, all terms (including technical and scientific terms) used herein have the same meaning as commonly understood by one of ordinary skill in the art to which this disclosed subject matter belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

FIG. 1 is a block diagram of an example embodiment of a system 100 in accordance with the disclosed subject matter. In various embodiments, the system 100 may include a computing device, such as, for example, a processor, a system-on-a-chip (SoC), a motherboard, a laptop, desktop, workstation, personal digital assistant, smartphone, tablet, and other appropriate computers or a virtual machine or virtual computing device thereof.

In the illustrated embodiment, the system 100 may include a processor 102. The processor 102 may be configured to execute instructions, such as the operating system (OS) 112. In various embodiments, as part of the execution of those instructions, the processor 102 may request various data accesses 132 (e.g., read operations, write operations).

The system 100 may include, in some embodiments, a memory 106 configured to store one or more pieces of data, either temporarily, permanently, semi-permanently, or a combination thereof. Further, the memory 106 may include volatile memory, non-volatile memory or a combination thereof. In various embodiments, the system 100 may include a storage medium configured to store data in a semi-permanent or substantially permanent form. In various embodiments, the storage medium (e.g., hard drive, solid state drive, flash memory) may be included by the memory 106.

In a specific embodiment, the memory 106 may include the main system memory where data is temporarily stored in a, traditionally, volatile manner. In such an embodiment, the memory 106 may include dynamic random access memory (DRAM). However, in another embodiment, the memory 106 may include magneto-resistive random access memory (MRAM) modules, phase-change memory (PRAM) modules, resistive type memory modules, or the like. It is understood that the above are a few illustrative examples to which the disclosed subject matter is not limited.

In the illustrated embodiment, the system 100 may include a memory management unit or circuit 104. The memory management circuit 104 may be configured to route, manage, and control data accesses from the processor 102 to the memory 106, and vice versa. In various embodiments, the memory management circuit 104 may include a memory (e.g., DRAM) controller circuit. In another embodiment, the memory management circuit 104 may be integrated with the processor 102 or the memory 106. It is understood that the above are a few illustrative examples to which the disclosed subject matter is not limited.

In the illustrated embodiment, the processor 102 may issue data accesses 108 that include or are associated with pieces of data 132 and indicate a memory address where that data 132 to be stored to or retrieved from. In this context, these addresses handled or used by the processor 102 are referred to as the public memory addresses 122.

In the illustrated embodiment, the system 100 may wish to store the data 132 with additional pieces of metadata 134. In one embodiment, the metadata 134 may include an error correction/detection code (ECC), as described above. Historically standard DRAM and the DRAM data interface have been particularly susceptible for bit failures for a variety of reasons. Cost-sensitive systems desire a solution that minimizes cost (e.g., no additional pins or external devices) and also minimizes overall performance loss. In the illustrated embodiment, this involves placing ECC information (e.g., metadata 134) in the bulk DRAM storage (i.e. the memory 106) along with the data 132 being protected and the ECC generation and correction to be done by the DRAM controller on-the-fly during system operation.

In various other embodiments, other forms of metadata 134 may be used. For example, the metadata 134 may include compression information, file attributes, security or access control information, and so on. It is understood that the above are a few illustrative examples to which the disclosed subject matter is not limited.

In the illustrated embodiment, the memory 106 may be configured to store, and the memory management circuit 104 may be configured to manage, a system wherein the metadata 134 is stored in the memory 106 in a way that is substantially invisible to the processor 102. In such an embodiment, the memory 106 may store the data 132 and metadata 134 in an interleaved fashion, where the metadata 134 is inserted next to the data 132. However, this insertion may mean that the actual memory address used to store the data 132 may be different from the one the processor 102 expects, as the metadata 134 has caused the placement of the data 132 to be shifted or offset. The details of this difference are described below.

To relieve the processor 102 from the burden of worrying about this offset or shift due to the interleaved metadata 134, the memory management circuit 104 may be configured to convert or translate the public memory address 122 provided by the processor 102 to an actual or private memory address 124. Further, in the illustrated embodiment, the memory management circuit 104 may be configured to generate (or in the cases of reads, validate) the metadata 134.

In such an embodiment, when the memory management circuit 104 receives the data access 108, with the data 132 and the public address 122, it may be configured to re-format or convert the processor's data access 122 into a form suitable for consumption by the memory 106, data access 110. As part of this conversion the memory management circuit 104 may convert or offset properly, the public address 122 to the private address 124. The data 132 (and metadata 134) may be stored within the memory 106 at the private memory address 124.

Figure 2:
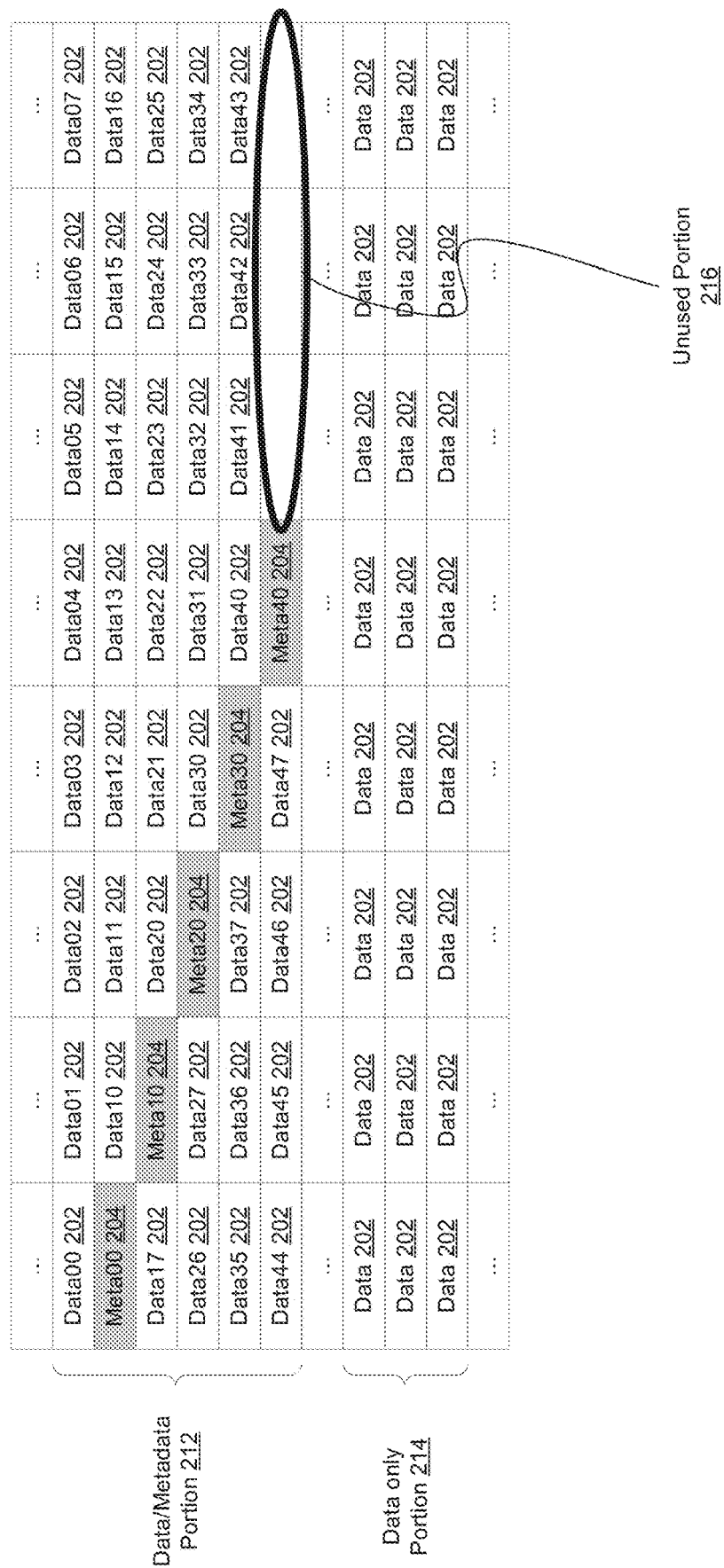
FIG. 2 is a block diagram of an example embodiment of a data structure in accordance with the disclosed subject matter.

FIG. 2 is a block diagram of an example embodiment of a data structure 200 in accordance with the disclosed subject matter. In various embodiments, the data structure 200 may be stored within the memory, as described above. It is understood that the data structure shown is one illustrative example to which the disclosed subject matter is not limited.

In the illustrated embodiment, various pieces of data 202 may be stored in the memory. The memory may be segregated or partitioned into various sections. In the illustrated embodiment, the data structure 200 is portioned into a first portion 212 that includes both data and metadata, and a second portion 214 that includes only data.

In various embodiments, the existence and placement of the partitions may be dynamically adjusted by the memory management circuit or processor. In such an embodiment, the user, operating system, etc. may control which data is associated with the metadata (e.g., protected by ECC) and which is not. As shown, the addition of metadata 204 includes the use of memory, and as such reduces the amount of storage for actual data 202. Further, in various embodiments, the meaning of the metadata 204 may change between data/metadata portions 212.

For example, in one such portion the metadata 204 may include ECC data, whereas in another the metadata 204 may include security data.

In various embodiments, when a data access occurs to the data-only portion 214 no metadata 204 may be generated, retrieved, or stored. Further, the public memory address may be the same as the actual or private memory address, as there is no metadata 204 causing the data 202 to be shifted or offset.

In the illustrated embodiment, for the data/metadata portion 212, each piece of metadata 204 associated with respective pieces or units of data 202 may be stored immediately after (or before, in various embodiments) the respective pieces of data 202. In the illustrated embodiment, each piece or unit of metadata 204 (e.g., Meta00) is associated with eight pieces of data 202 (e.g., Data00, Data01, Data02, Data03, Data04, Data05, Data06, and Data07).

In the illustrated embodiment, the data 202 and metadata 204 may be stored in a ratio that is a power of two (e.g., 8:1, 16:1). In the illustrated embodiment, the ratio is 8:1. It is understood that the above is one illustrative example to which the disclosed subject matter is not limited.

This power-of-two ratio differs from traditional ECC storage methods which often employ a 7:1 ratio. The data is usually stored as 7 cache lines of data and 7 corresponding bytes of ECC. As the 7 bytes of ECC are often stored in an 8 byte cache line, this wastes one byte of storage. In addition, due to the non-power-of-two ratio (multiplication and division by 7), the processor or memory management circuit performs rather complex computations to determine the proper private memory address.

Likewise, a third form of storage involves placing all the ECC data at the beginning/end of the memory space. This also involves poor performance because a metadata address is computed and different memory pages are used to store the data/metadata. Further, partitioning or segregating the memory into data-only and data/metadata portions becomes difficult or wastes a lot of storage. The illustrated embodiment avoids these issues.

In the illustrated embodiment, the data/metadata portion 212 may not be sized for the data 202/metadata 204 to perfectly fit into it. For example, with an 8:1 ratio, 9 spaces or cachelines may be needed to fit a full data/metadata grouping and the size of the portion 212 may not be divisible by 9. In such an embodiment, the memory 200 may include an unused portion 216 (e.g., remaining space after division by 9) that are not accessible by the processor. In various embodiments, any such unused portion 216 may be relatively minimal or small as they may be limited to the size of the data/metadata grouping (e.g., fewer than 9 cachelines). This may simply be avoided by selecting a size of the data/metadata portion 212 that is fully divisible by 9. In another embodiment, the memory 200 may include keep-out portions 216 for other reasons.

FIG. 3 is a diagram of an example embodiment of a technique 300 in accordance with the disclosed subject matter. In various embodiments, the technique 300 may be used or produced by the systems such as those of FIG. 1, 4, 5A, 5B, or 6. Furthermore, portions of technique 300 may be used to produce a data structure such as that of FIG. 2. Although, it is understood that the above are a few illustrative examples to which the disclosed subject matter is not limited. It is understood that the disclosed subject matter is not limited to the ordering of or number of actions illustrated by technique 300.

In the illustrated embodiment, two groupings (plus a little of a third grouping) of data/metadata are shown. It is understood that the above are a few illustrative examples to which the disclosed subject matter is not limited.

In the illustrated embodiment, the data access may include or provide the public address 302. The first address in the data/metadata memory portion may be stored for further use and may be referred to as the base memory address 350. In the illustrated embodiment, the base memory address 350 has the value 0x2400000.

In the illustrated embodiment, as can be seen all of the pieces of data are associated with respective public memory addresses 302. Whereas the pieces of metadata are not associated with a public memory address 302. This is because the storage formatting and data structure of the data/metadata is hidden or generally not a concern of the requesting device (e.g., the processor). While the processor may know that a memory portion includes metadata, it is not responsible for adjusting its (public) memory addresses to take that into account. In the illustrated embodiment, column 304 shows the type of data (e.g., data or metadata) that is stored at the address.

In the illustrated embodiment, the memory management circuit may be configured to calculate a cacheline number 306 within the memory portion or block. In various embodiments, this may be done by performing a bit-wise XOR of the public memory address 302 of the data access and the base address memory address 350, and then dividing that result by 64 (for an 8:1 ratio embodiment). In various embodiments, the division by 64 may be performed by right-shifting the result by 6 bits. Again, this ability to perform calculations by simple shifting is an advantage of the power-of-two ratio system as compared to the traditional 7:1 ratio system. In such an embodiment, the cacheline number 306 may indicate how many pieces (or cachelines) of data have (or can be) stored in this memory portion (i.e. data/metadata portion) before the current piece of data.

In the illustrated embodiment, the memory management circuit may be configured to calculate a cacheline chunk byte address 308. In various embodiments, this may be done by dividing the cacheline number 306 by 8 (for an 8:1 ratio embodiment) and setting the quotient as the cacheline chunk byte address 308. In various embodiments, the division by 8 may be performed by right-shifting the cacheline number 306 by 3 bits. In such an embodiment, the cacheline chunk number 308 may indicate how many data/metadata groupings (e.g., 8 pieces of data and 1 piece of metadata) have (or can be) stored in this memory portion (i.e. data/metadata portion) before the current piece of data. In various embodiments, for example ones in which sequential memory access is guaranteed, this may be same for all pieces of data/metadata in a given grouping. In such an embodiment, the calculation may be performed only for the first piece of data in the grouping (e.g., public addresses 0x2400000 or 0x2400200, in this example). However, most embodiments, in which no such guarantee exists, the calculation may be performed for every memory access.

In the illustrated embodiment, the memory management circuit may be configured to calculate a cacheline chunk byte address or offset 310. In various embodiments, this may be done by multiplying the cacheline chunk number 308 by 512. In various embodiments, this is the size of the chunk or 8 cache lines times 64 bytes per cache line, which equals 512. In various embodiments, the multiplication by 512 may be performed by left-shifting the cacheline chunk number 308 by 9 bits. In such an embodiment, the cacheline chunk byte address 310 may indicate a number of memory addresses between base memory address 350 (e.g., public address 0x2400000) and the start of the current data/metadata grouping (e.g., public address 0x2400200, for the second grouping). Again, in embodiments in which sequential address is guaranteed, some calculations may be performed only on the first piece of data in the grouping.

In the illustrated embodiment, the memory management circuit may be configured to calculate a metadata block insertion offset 312. In various embodiments, this may be done by multiplying the cacheline chunk number 308 by 64. In various embodiments, the multiplication by 64 may be performed by left-shifting the cacheline chunk number 308 by 6 bits. In such an embodiment, the metadata block insertion offset 312 may indicate a number of memory addresses, between the base memory address 350 and public memory address 302 of the data access, that are occupied or used by the pieces of metadata. Again, in embodiments in which sequential address is guaranteed, some calculations may be performed only on the first piece of data in the grouping.

In the illustrated embodiment, the memory management circuit may be configured to calculate the actual or private memory address 314 for each piece of data or metadata. While the public memory addresses 302 and private memory addresses 314 might agree or be in sync for the initial portions of the data stream or beginning of the data/metadata portions (e.g., addresses 0x2400000-0x24001C0), it can be seen that they begin to diverge as new pieces of metadata are inserted or interleaved into the data. For example, by the time the last piece of data (in this example, data 320) is reached, the public address 302 is 0x2400400, whereas the private address 314 is 0x2400480, due to the two pieces of metadata inserted in the memory (at private addresses 0x2400200 and 0x2400440).

In various embodiments, the memory management circuit may be configured to calculate private memory address 314, for data pieces, by adding the metadata block insertion offset 312 to the public memory address 302. For example, the private address 314 for the data 320 may be calculated by adding 0x40 to 0x24003C0, resulting in 0x2400400.

In such an embodiment, the memory management circuit may be configured to calculate private memory address 314, for metadata pieces, by adding the metadata block insertion offset 312, plus the cacheline chunk byte address 310, and the cacheline group size (e.g., 0x200, in this example, since 8 cache lines times 64 bytes per cacheline equals 512 bytes) to the base memory address 350. For example, the private address 314 for the metadata 318 may be calculated by adding 0x040, plus 0x200, plus a second 0x200, to 0x2400000, resulting in 0x2400440.

In various embodiments, a certain number of public addresses 302 may be unusable due to the insertion of the metadata. In the illustrated embodiment, this is represented by the keep out portion 322. These public memory addresses 302 are not wasted storage (like the unused portion 216 of FIG. 2), but are phantom or skipped memory addresses values that have been already used in the private address space due to the metadata. For example, one will note that the private addresses 314, in the illustrated embodiment, stop at 0x2400440, but the last publicly used address 302 is 0x24003C0. Therefore, an offset in the public memory address space is used to align the public addresses 302 to the private addresses 314. In this case, with the two metadata portions, this is the keep out portion 322 or public addresses 0x2400400 and 0x2400440. If the data/metadata portion had been larger the number of offsetting phantom, or skipped public address values in the keep out portion 322 would have been greater. In such an embodiment, the keep out portion 322 may occur at the end of the data/metadata portion to re-align the public/private memory space at the beginning of a data-only portion (not shown in FIG. 3, but shown as portion 214 of FIG. 2), and the operating system (or processor) may be told to not use the public memory address values of the keep out portion 322.

It is understood that the above is one illustrative example to which the disclosed subject matter is not limited.

FIG. 4 is a block diagram of an example embodiment of a system 400 in accordance with the disclosed subject matter. In various embodiments, the system 400 may include a memory management controller or circuit, as described above. In a specific embodiment, the system 400 may include or be included by a DRAM controller. It is understood that the above is one illustrative example to which the disclosed subject matter is not limited.

In the illustrated embodiment, the system 400 may include a processor-side interface 402. The processor-side interface 402 may be configured to transmit or receive data accesses (e.g., read, write) that include, are based (at least in part) upon, or are associated with a public memory address 432, as described above.

In the illustrated embodiment, the system 400 may include a memory-side interface 404. The memory-side interface 404 may be configured to transmit or receive data accesses (e.g., read, write) that include, are based (at least in part) upon, or are associated with an actual or private memory address 434, as described above. As described above, the system 400 may be configured to cause the memory to store data and metadata together in an interleaved pattern in which the ratio of data to metadata is a power of two (e.g., $2^n:1$, where n is positive integer).

In the illustrated embodiment, the system 400 may include an address conversion circuit 406. In various embodiments, the address conversion circuit 406 may be configured to convert the public memory address 432 to a private memory address 434 in a way that takes into account the interleaving of the data and metadata. In such an embodiment, the address conversion circuit 406 may include a cacheline number calculation circuit 412 to calculate the cacheline number 306, a cacheline chunk calculation circuit 414 to calculate the cacheline chunk number 308, a chunk offset calculation circuit 416 to calculate the cacheline chunk byte address or offset 310, a cacheline offset calculation circuit 418 to calculate the metadata block insertion offset 312, and a predetermined offset 419 (e.g., the cacheline group size), each configured to compute or determine their respective values, as describe above in relation to FIG. 3 or below in relation to FIGS. 5A and 5B. Although, it is understood that the details of how those calculations occur are a few illustrative examples to which the disclosed subject matter is not limited.

In the illustrated embodiment, the system 400 may include a memory map 408. In various embodiments, the memory map 408 may include comparator circuits, registers, and/or various data structures. In such an embodiment, the memory map 408 may be configured to indicate which portion(s) of the publicly addressable memory space are associated with both data and metadata and their required keep-out areas, and which portion(s) of the memory are associated with just data, as described above. In various embodiments, there may be a plurality of data/metadata portions and a plurality of data-only portions. As described above, in various embodiments, the memory map 408 may indicate what the metadata represents (e.g., ECC, security information, compression information) in each data/metadata portion.

In the illustrated embodiment, the system 400 may include a metadata generator and/or checker circuit 410. In one embodiment, the metadata generator circuit 410 may create, compute, or generate the metadata (e.g., the ECC bits). In one embodiment, the metadata checker circuit 410 may check that the metadata is correct (e.g., in the case of ECC metadata) or that an action associated with the data access is allowable (e.g., in the case of security metadata) or otherwise correct. In such an embodiment, the system 400 may be configured to report to the processor (or other circuit) if an error has occurred. For example, if an ECC error has been detected and/or is uncorrectable, an interrupt may be issued. It is understood that the above are a few illustrative examples to which the disclosed subject matter is not limited.

Figure 5A:
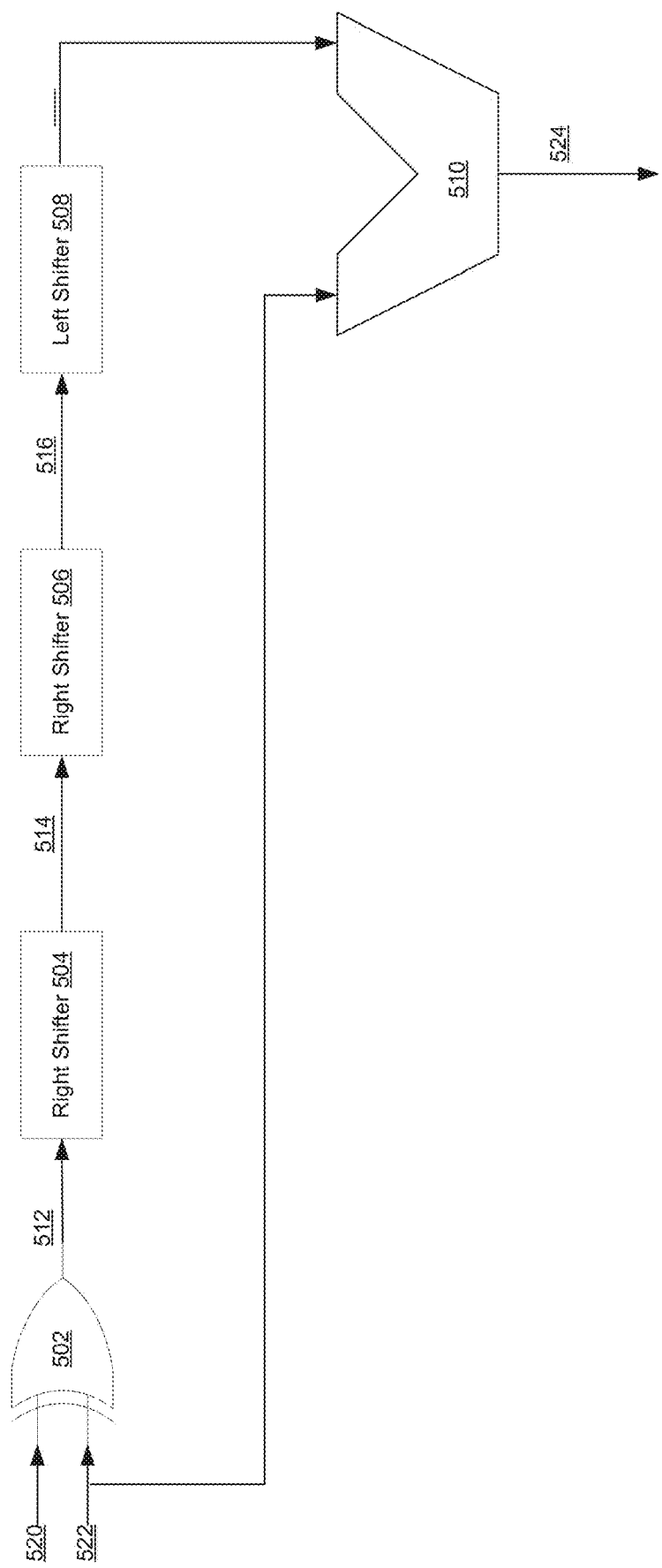
FIG. 5A is a block diagram of an example embodiment of a system in accordance with the disclosed subject matter.

FIG. 5A is a block diagram of an example embodiment of a system 500 in accordance with the disclosed subject matter. In various embodiments, the system 500 may be included by a memory controller or management circuit, as described above.

In the illustrated embodiment, the system 500 may be employed, for pieces of data, to convert a public memory address 522 to an actual or private memory address 524. It is understood that the above is one illustrative example to which the disclosed subject matter is not limited.

In the illustrated embodiment, the system 500 may include a cacheline number calculation circuit that includes a bit-wise XOR gate or circuit 502 and a right shift circuit 504. In such an embodiment, the bit-wise XOR gate 502 may take the public memory address 522 and base address 520 as an input and produce the output 512. In various embodiments, the base address 520 may be generated by masking the public memory address 522; although, it is understood that the above is merely one illustrative example to which the disclosed subject matter is not limited. The right shift circuit 504 may take this result 512 as an input, shift the result 512 to the right by 6 bits (or as many bits as dictated by the data-to-metadata ratio), and produce the cacheline number 514.

In the illustrated embodiment, the system 500 may include a cacheline chunk calculation circuit that includes a right shift circuit 506. In such an embodiment, the right shift circuit 506 may take cacheline number 514 as an input and shift it to the right by 3 bits (or as many bits as dictated by the data-to-metadata ratio) to produce the cacheline chunk number 516. In various embodiments, the cacheline number calculation circuit may be combined with the cacheline chunk calculation circuit.

In the illustrated embodiment, the system 500 may include a chunk offset calculation circuit that includes a left shift circuit 508. In such an embodiment, the left shift circuit 506 may take the cacheline chunk number 516 as an input and shift it to the left by 9 bits (or as many bits as dictated by the data-to-metadata ratio) to produce the cacheline chunk byte address 518. In various embodiments, this may be combined with the previous shift operations.

In the illustrated embodiment, the system 500 may include a data address calculation circuit that includes, in addition the above, the data adder 510. In such an embodiment, the data adder may add the cacheline chunk byte address 518 to the public memory address 522 to produce the private (data) memory address 524.

FIG. 5B is a block diagram of an example embodiment of a system 550 in accordance with the disclosed subject matter. In various embodiments, the system 550 may be included by a memory controller or management circuit, as described above.

In the illustrated embodiment, the system 550 may be employed, for pieces of metadata, to convert a public memory address 522 to an actual or private memory address 574 for the metadata. It is understood that the above is one illustrative example to which the disclosed subject matter is not limited.

In the illustrated embodiment, the system 550 may include the bit-wise XOR gate 502, the right shift circuits 504 & 506, and the left shift circuit 508, as described above. In such an embodiment, these circuits may respectively product the output 512, the cacheline number 514, the cacheline chunk number 516, and the cacheline chunk byte address 518, as described above.

In addition, the system 550 may include a cacheline offset calculation circuit that includes a left shift circuit 558. In such an embodiment, the left shift circuit 558 may take the cacheline chunk number 516 as an input and shift it to the left by 6 bits (or as many bits as dictated by the data-to-metadata ratio) to produce the metadata block offset 568.

In the illustrated embodiment, the system 550 may include a metadata address calculation circuit that includes, in addition to the above, the metadata adder 560. In such an embodiment, the metadata adder may add the cacheline chunk byte address 518, the metadata block offset 568, and a predetermined offset 570 (e.g., 0x200) to the base memory address 520 to produce the private (metadata) memory address 574.

Figure 6:
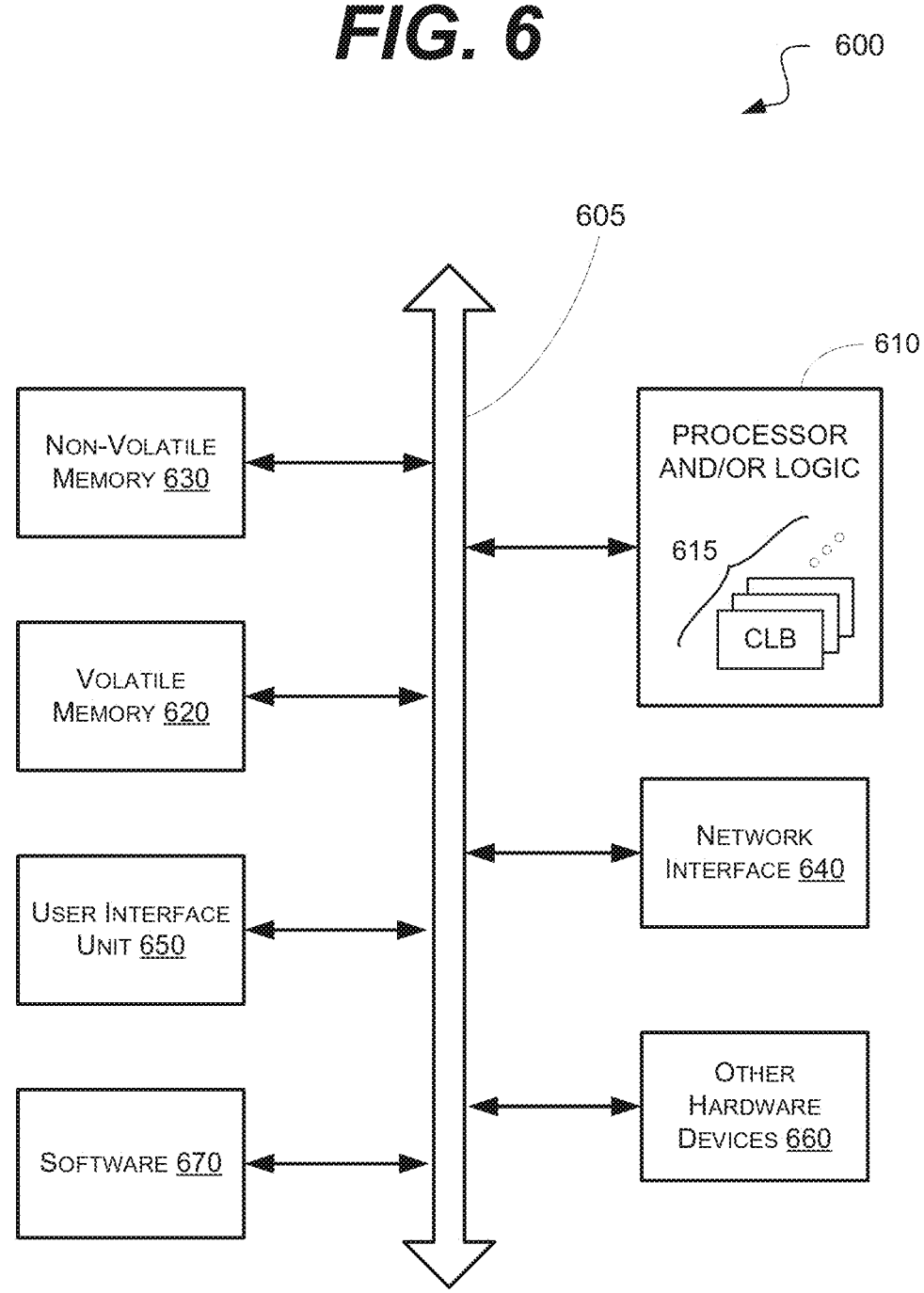
FIG. 6 is a schematic block diagram of an information processing system that may include devices formed according to principles of the disclosed subject matter.

FIG. 6 is a schematic block diagram of an information processing system 600, which may include semiconductor devices formed according to principles of the disclosed subject matter.

Referring to FIG. 6, an information processing system 600 may include one or more of devices constructed according to the principles of the disclosed subject matter. In another embodiment, the information processing system 600 may employ or execute one or more techniques according to the principles of the disclosed subject matter.

In various embodiments, the information processing system 600 may include a computing device, such as, for example, a laptop, desktop, workstation, server, blade server, personal digital assistant, smartphone, tablet, and other appropriate computers or a virtual machine or virtual computing device thereof. In various embodiments, the information processing system 600 may be used by a user (not shown).

The information processing system 600 according to the disclosed subject matter may further include a central processing unit (CPU), logic, or processor 610. In some embodiments, the processor 610 may include one or more functional unit blocks (FUBs) or combinational logic blocks (CLBs) 615. In such an embodiment, a combinational logic block may include various Boolean logic operations (e.g., NAND, NOR, NOT, XOR), stabilizing logic devices (e.g., flip-flops, latches), other logic devices, or a combination thereof. These combinational logic operations may be configured in simple or complex fashion to process input signals to achieve a desired result. It is understood that while a few illustrative examples of synchronous combinational logic operations are described, the disclosed subject matter is not so limited and may include asynchronous operations, or a mixture thereof. In one embodiment, the combinational logic operations may comprise a plurality of complementary metal oxide semiconductors (CMOS) transistors. In various embodiments, these CMOS transistors may be arranged into gates that perform the logical operations; although it is understood that other technologies may be used and are within the scope of the disclosed subject matter.

The information processing system 600 according to the disclosed subject matter may further include a volatile memory 620 (e.g., a Random Access Memory (RAM)). The information processing system 600 according to the disclosed subject matter may further include a non-volatile memory 630 (e.g., a hard drive, an optical memory, a NAND or Flash memory). In some embodiments, either the volatile memory 620, the non-volatile memory 630, or a combination or portions thereof may be referred to as a "storage medium". In various embodiments, the volatile memory 620 and/or the non-volatile memory 630 may be configured to store data in a semi-permanent or substantially permanent form.

In various embodiments, the information processing system 600 may include one or more network interfaces 640 configured to allow the information processing system 600 to be part of and communicate via a communications network. Examples of a Wi-Fi protocol may include, but are not limited to, Institute of Electrical and Electronics Engineers (IEEE) 802.11g, IEEE 802.11n. Examples of a cellular protocol may include, but are not limited to: IEEE 802.16m (a.k.a. Wireless-MAN (Metropolitan Area Network) Advanced, Long Term Evolution (LTE) Advanced, Enhanced Data rates for GSM (Global System for Mobile Communications) Evolution (EDGE), Evolved High-Speed Packet Access (HSPA+). Examples of a wired protocol may include, but are not limited to, IEEE 802.3 (a.k.a. Ethernet), Fibre Channel, Power Line communication (e.g., HomePlug, IEEE 1901). It is understood that the above are merely a few illustrative examples to which the disclosed subject matter is not limited.

The information processing system 600 according to the disclosed subject matter may further include a user interface unit 650 (e.g., a display adapter, a haptic interface, a human interface device). In various embodiments, this user interface unit 650 may be configured to either receive input from a user and/or provide output to a user. Other kinds of devices may be used to provide for interaction with a user as well; for example, feedback provided to the user may be any form of sensory feedback, e.g., visual feedback, auditory feedback, or tactile feedback; and input from the user may be received in any form, including acoustic, speech, or tactile input.

In various embodiments, the information processing system 600 may include one or more other devices or hardware components 660 (e.g., a display or monitor, a keyboard, a mouse, a camera, a fingerprint reader, a video processor). It is understood that the above are merely a few illustrative examples to which the disclosed subject matter is not limited.

The information processing system 600 according to the disclosed subject matter may further include one or more system buses 605. In such an embodiment, the system bus 605 may be configured to communicatively couple the processor 610, the volatile memory 620, the non-volatile memory 630, the network interface 640, the user interface unit 650, and one or more hardware components 660. Data processed by the processor 610 or data inputted from outside of the non-volatile memory 630 may be stored in either the non-volatile memory 630 or the volatile memory 620.

In various embodiments, the information processing system 600 may include or execute one or more software components 670. In some embodiments, the software components 670 may include an operating system (OS) and/or an application. In some embodiments, the OS may be configured to provide one or more services to an application and manage or act as an intermediary between the application and the various hardware components (e.g., the processor 610, a network interface 640) of the information processing system 600. In such an embodiment, the information processing system 600 may include one or more native applications, which may be installed locally (e.g., within the non-volatile memory 630) and configured to be executed directly by the processor 610 and directly interact with the OS. In such an embodiment, the native applications may include pre-compiled machine executable code. In some embodiments, the native applications may include a script interpreter (e.g., C shell (csh), AppleScript, AutoHotkey) or a virtual execution machine (VM) (e.g., the Java Virtual Machine, the Microsoft Common Language Runtime) that are configured to translate source or object code into executable code which is then executed by the processor 610.

The semiconductor devices described above may be encapsulated using various packaging techniques. For example, semiconductor devices constructed according to principles of the disclosed subject matter may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique, a wafer-level processed stack package (WSP) technique, or other technique as will be known to those skilled in the art.

Method steps may be performed by one or more programmable processors executing a computer program to perform functions by operating on input data and generating output. Method steps also may be performed by, and an apparatus may be implemented as, special purpose logic circuitry, e.g., an FPGA (field programmable gate array) or an ASIC (application-specific integrated circuit).

In various embodiments, a computer readable medium may include instructions that, when executed, cause a device to perform at least a portion of the method steps. In some embodiments, the computer readable medium may be included in a magnetic medium, optical medium, other medium, or a combination thereof (e.g., CD-ROM, hard drive, a read-only memory, a flash drive). In such an embodiment, the computer readable medium may be a tangibly and non-transitorily embodied article of manufacture.

While the principles of the disclosed subject matter have been described with reference to example embodiments, it will be apparent to those skilled in the art that various changes and modifications may be made thereto without departing from the spirit and scope of these disclosed concepts. Therefore, it should be understood that the above embodiments are not limiting, but are illustrative only. Thus, the scope of the disclosed concepts are to be determined by the broadest permissible interpretation of the following claims and their equivalents, and should not be restricted or limited by the foregoing description. It is, therefore, to be understood that the appended claims are intended to cover all such modifications and changes as fall within the scope of the embodiments.

What is claimed is:

1. An apparatus comprising:
  a first interface for receiving a data access based upon a public memory address;
  a second interface for communicating with a memory to fulfill the data access, the apparatus being configured to cause the memory to store units of data with a unit of metadata associated with the units of data in a ratio of each power-of-two contiguous units of data to one unit of metadata together in an interleaved pattern in which the unit of metadata succeeds each power-of-two contiguous units of data in the memory; and
  an address conversion circuit configured to convert the public memory address to a private memory address in a way that takes into account the interleaved pattern of the units of data and metadata associated with the units of data.

2. The apparatus of claim 1, wherein the apparatus further comprises a memory map configured to indicate which one or more portions of the memory store both data and metadata associated with the data, and which one or more portions of the memory store data; and
  wherein the address conversion circuit is configured to set the private memory address equal to the public memory address for the one or more portions of the memory that stores data.

3. The apparatus of claim 1, wherein the address conversion circuit comprises:

a cacheline number calculation circuit configured to determine a cacheline number of a portion of memory associated with the public memory address;

a cacheline chunk calculation circuit configured to determine a number of times within the portion of memory that the ratio of each power-of-two contiguous units of data to one unit of metadata has occurred within the portion of memory;

a chunk offset calculation circuit configured to determine a first offset based, at least in part upon, the number of times within the portion of memory that the ratio of each power-of-two contiguous units of data to one unit of metadata has occurred within the portion of memory; and a cacheline offset calculation circuit configured to determine a second offset based, at least in part upon, the cacheline number.

4. The apparatus of claim 3, wherein cacheline number calculation circuit comprises a bitwise XOR circuit and a right-shift circuit;

wherein the cacheline chunk calculation circuit comprises a right-shift circuit; and wherein the chunk offset calculation circuit comprises a left-shift circuit.

5. The apparatus of claim 3, wherein the address conversion circuit is configured to:

determine the private memory address for each cacheline of data by:

adding, to the public memory address, a first offset based, at least in part upon, the number of times within the portion of memory that the ratio of each power-of-two contiguous units of data to one unit of metadata has occurred within the portion of memory, and a second offset based, at least in part upon, the cacheline number; and determine the private memory address for each cacheline of metadata by:

adding to the public memory address, the first offset and a predetermined offset based, at least in part, upon the ratio of data to metadata.

6. The apparatus of claim 1, wherein the data access includes both data and metadata, and the contiguous units of data to one unit of metadata are interleaved at a ratio of 8:1.

7. The apparatus of claim 1, wherein the data access includes a write access of data and no metadata; and wherein the apparatus is configured to generate metadata associated with data of the write access.

8. The apparatus of claim 1, wherein the metadata comprises error correction/detection data;

wherein the data access includes a write access; and wherein the apparatus is configured to compare metadata associated with data of the write access and correct a detected error.

9. The apparatus of claim 1, wherein the address conversion circuit comprises a bit-wise XOR circuit, four shift circuits, and an adder that are configured to generate a private memory address for metadata.

10. The apparatus of claim 1, wherein the address conversion circuit comprises a bit-wise XOR circuit, three shift circuits, and an adder that are configured to generate a private memory address for data.

11. An apparatus comprising:

a first interface for receiving a first data access based upon a public memory address;

a second interface for communicating with a memory to fulfill the first data access, the apparatus being configured to cause the memory to store units of data with a unit of metadata associated with the units of data together in an interleaved pattern in a region of the memory, the metadata comprises error correction information; and an address conversion circuit configured to convert the public memory address to a private memory address for the first data access in a way that takes into account the interleaved pattern of the data and the metadata.

12. The apparatus of claim 11, wherein the metadata in the region of the memory is interleaved with the data based on a ratio of a power-of-two contiguous units of data to one unit of metadata.

13. The apparatus of claim 11, wherein the apparatus further comprises a memory map configured to indicate at least one first portion of the memory is associated with both data and metadata, and at least one second portion of the memory associated with data; and wherein the address conversion circuit is configured to set the private memory address equal to the public memory address for the at least one second portion of the memory.

14. The apparatus of claim 13, wherein the address conversion circuit comprises:

a cacheline number calculation circuit configured to determine a cacheline number of the at least one second portion of the memory associated with the public memory address;

a cacheline chunk calculation circuit configured to determine a number of times within the at least one first portion that a ratio of each power-of-two contiguous units of data to one unit of metadata has occurred within the at least one first portion of the memory;

a chunk offset calculation circuit configured to determine a first offset based, at least in part upon, the number of times within the at least one first portion that the ratio of each power-of-two contiguous units of data to one unit of metadata has occurred within the at least one first portion of the memory; and a cacheline offset calculation circuit configured to determine a second offset based, at least in part upon, the cacheline number.

15. The apparatus of claim 14, wherein the address conversion circuit is configured to:

determine the private memory address for a cacheline of data by:

adding, to the public memory address, a first offset based, at least in part upon, the number of times within the at least one first portion of the memory that the ratio of each power-of-two contiguous units of data to one unit of metadata has occurred within the at least one first portion of the memory, and a second offset based, at least in part upon, the cacheline number; and determine the private memory address for a cacheline of metadata by:

adding to the public memory address, the first offset and a predetermined offset based, at least in part upon the ratio of each power-of-two contiguous units of data to one unit of metadata.

16. The apparatus of claim 11, wherein the first data access includes a write access of data and no metadata; and wherein the apparatus is configured to generate metadata associated with data of the write access.

17. The apparatus of claim 11, wherein the metadata comprises error detection data;

wherein the first data access includes a write access; and wherein the apparatus is configured to compare metadata associated with data of the write access and detect an error.

18. The apparatus of claim 11, wherein the address conversion circuit comprises a bit-wise XOR circuit, four shift circuits, and an adder are configured to generate a private memory address for metadata.

19. The apparatus of claim 11, wherein the second interface is configured to perform a second data access to the memory, wherein the second data access includes the private memory address and is associated with data of the first data access and the metadata.

20. The apparatus of claim 11, wherein the address conversion circuit configured to:
   add an additional offset between the public memory address and the private memory address based on the a private memory address being configured to store metadata.

* * * * *